United States Patent

Roza

[11] Patent Number: 5,939,943
[45] Date of Patent: Aug. 17, 1999

[54] AMPLIFIER WITH IMPROVED OUTPUT VOLTAGE SWING

[75] Inventor: Engel Roza, Eindhoven, Netherlands

[73] Assignee: U.S. Philips Corporation, New York, N.Y.

[21] Appl. No.: 08/990,569

[22] Filed: Dec. 12, 1997

[30] Foreign Application Priority Data

Dec. 20, 1996 [EP] European Pat. Off. .............. 96203646

[51] Int. Cl.[6] ....................................................... H03F 3/45
[52] U.S. Cl. ........................................... 330/253; 330/261
[58] Field of Search .................................. 330/253, 261, 330/297, 306

[56] References Cited

U.S. PATENT DOCUMENTS 4,371,844  2/1983  Boeke ...................................... 330/253

5,361,042  11/1994  Gist ......................................... 330/261

*Primary Examiner*—Robert Pascal
*Assistant Examiner*—Henry Choe
*Attorney, Agent, or Firm*—Brian J. Wieghaus

[57] ABSTRACT

An amplifier comprising an amplifier stage having an input terminal (1) for receiving an input signal; an output terminal (2) for supplying an output signal; an amplifier transistor (4); and a load (5). The load (5) comprises a first (T1) and a second (T2) field effect transistor. The current-voltage characteristic of the load (5) is similar to the diode characteristic of a conventional load formed by means of a diode-connected field effect transistor. The threshold voltage of the load (5) comprising the first (T1) and the second (T2) field effect transistor is much smaller than the threshold voltage of a conventional diode, which results in an improved output voltage swing of the amplifier stage.

6 Claims, 2 Drawing Sheets

AMPLIFIER WITH IMPROVED OUTPUT VOLTAGE SWING

BACKGROUND OF THE INVENTION

The invention relates to an amplifier comprising an amplifier stage having an input terminal for receiving an input signal; an output terminal for supplying an output signal in response to the input signal; a supply terminal; an amplifier transistor having a main current path coupled to the output terminal; and a load coupled between the output terminal and the supply terminal.

Such an amplifier is known from the general state of the art. The load in such an amplifier takes the form of a diode, which is generally constructed as a diode-connected transistor. The voltage gain of the amplifier stage is then determined by the ratio between the transconductances of the amplifier transistor and the diode-connected transistor.

A disadvantage of the known amplifier stage is that the voltage on the output terminal cannot approximate to the voltage on the supply terminal owing to the threshold voltage of the diode. For certain uses it is necessary that the voltage on the output terminal approximates to the voltage on the supply terminal.

SUMMARY OF THE INVENTION

It is an object of the invention to provide an amplifier having an amplifier stage of which the voltage on the output terminal approximates to the voltage on the supply terminal.

To this end, in accordance with the invention, the amplifier of the type defined in the opening paragraph is characterized in that the load comprises: a first field effect transistor having a source coupled to the supply terminal, a drain coupled to the output terminal, and a gate; and a second field effect transistor having a source coupled to the output terminal, a drain coupled to the gate of the first field effect transistor, and a gate coupled to the drain of the second field effect transistor.

The voltage difference between the supply terminal and the output terminal is equal to the voltage difference between the gate-source voltage of the first field effect transistor and the gate-source voltage of the second field effect transistor. In the case of a suitable dimensioning of the first and the second field effect transistor with respect to one another, this voltage difference can be small. Since this small voltage difference also forms the source-drain voltage of the first field effect transistor, the first field effect transistor will (generally) not be in the saturation region but in its linear operating region. In spite of the fact that the first field effect transistor is in its linear operating region the load has an impedance characteristic similar to that of a diode-connected conventional field effect transistor. The load in fact behaves as a diode whose threshold voltage is much smaller the threshold voltage of a conventional diode.

BRIEF DESCRIPTION OF THE DRAWINGS

The invention will be described in more detail with reference to the accompanying drawings, in which.

In these Figures like parts or elements bear the same reference symbols.

DESCRIPTION OF THE PREFERRED EMBODIMENTS

Figure 1:
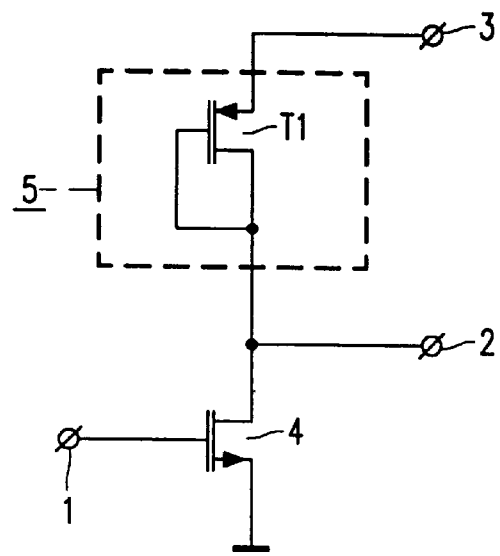
FIG. 1 shows a conventional amplifier stage of an amplifier.

FIG. 1 shows a conventional amplifier stage having an input terminal 1 for receiving an input signal; an output terminal 2 for supplying an output signal in response to the input signal; a supply terminal 3; an amplifier transistor 4 having a main current path coupled to the output terminal 2; and a load in the form of a diode-connected first field effect transistor T1, which is coupled between the output terminal 2 and the supply terminal 3. The gate-source voltage of the first field effect transistor T1 is given by:

$$V_{GS1} = \sqrt{(2*I/\beta_1)} + V_{T1} \qquad [1]$$

Here, $V_{GS1}$ is the gate-source voltage of the first field effect transistor T1; I is the direct current through the main current path of the first field effect transistor T1; $\beta$ is a parameter of the field effect transistor, which parameter is directly proportional to the width of the gate and inversely proportional to the length of the gate and which further depends on the thickness of the gate oxide, the charge mobility and the dielectric constant of the gate oxide; $\beta_1$ is a parameter which refers to the parameter $\beta$ in relation to the first field effect transistor T1; $V_{T1}$ is the threshold voltage of the first field effect transistor T1.

The differential resistance $R_c$ of the load 5 can be calculated by means of differentiation of the first formula [1] with respect to the direct current I. Thus, the differential resistance $R_C$ is given by:

$$R_C = 1/\sqrt{(2*I*\beta_1)} \qquad [2]$$

From formula [2] it follows that the differential resistance $R_C$ depends only on the parameter $\beta_1$ if the direct current I through the first field effect transistor T1 is known. The spread in the parameter $\beta_1$ is not very large. Consequently, the differential resistance $R_C$ can be predicted fairly accurately.

Figure 2:
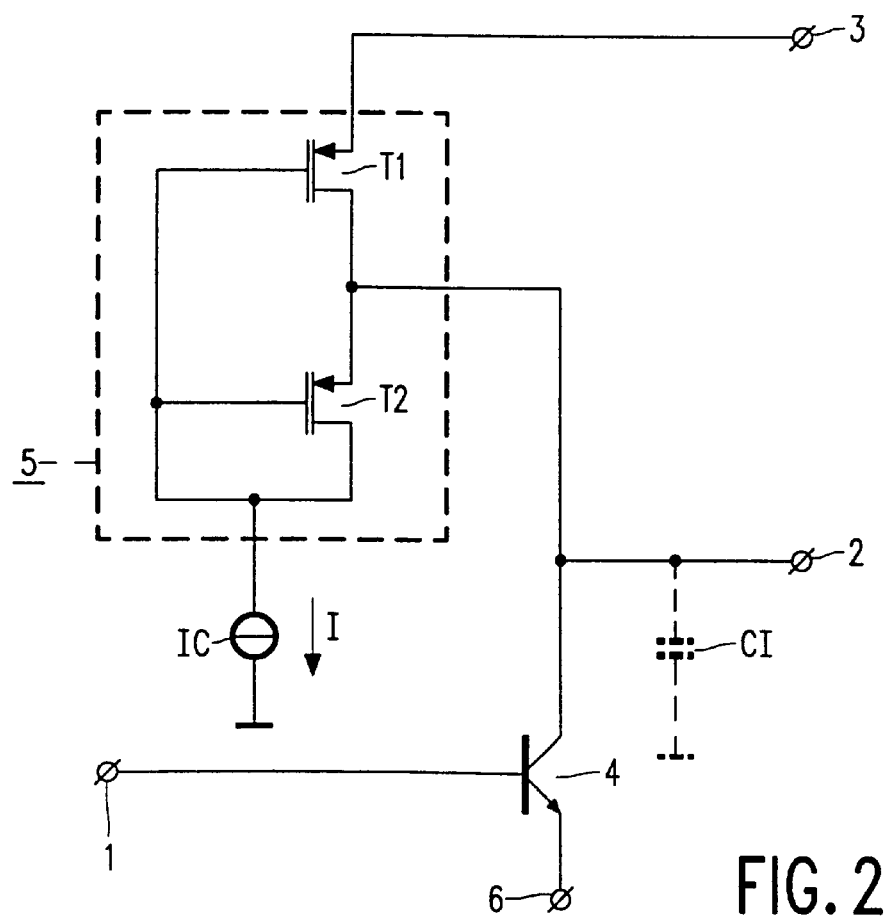
FIG. 2 shows a first embodiment of an amplifier stage of an amplifier in accordance with the invention.

FIG. 2 shows a first embodiment of an amplifier stage of an amplifier in accordance with the invention. The first amplifier transistor 4 is, for example, a bipolar transistor but can alternatively be a field effect transistor, as in FIG. 1. The amplifier transistor 4 has its emitter coupled to a terminal 6. The amplifier stage further comprises a second field effect transistor T2 having its source coupled to the output terminal 2 and having its gate and drain coupled to the gate of the first field effect transistor T1. A current source IC1 is coupled to the drain of the second field effect transistor T2. The current source IC provides the direct current I through the main current path of the second transistor T2. If an integration capacitor CI is coupled to the output terminal 2 the amplifier stage in fact constitutes an integrator whose time constant is determined by the product of the differential resistance $R_N$ of the load 5, which is formed by the first and the second field effect transistor T1, T2, and the capacitance value of the integration capacitor CI. The differential resistance $R_N$ is given by:

$$R_N = 1/\{\beta_1 *(V_{GS1}-V_{T1}-V_{DS1})\} \qquad [3]$$

Here, $V_{DS1}$ is the drain-source voltage of the first field effect transistor T1. Since the drain-source voltage $V_{DS1}$ of the first field effect transistor T1 is equal to the voltage difference between the gate-source voltage $V_{GS1}$ of the first field effect transistor T1 and the gate-source voltage $V_{GS2}$ of the second field effect transistor T2 the drain-source voltage $V_{DS1}$ of the first field effect transistor T1 is usually very low. As a result of this, the differential resistance $R_N$ can be approximated to by:

$$R_N = 1/\{\beta_1 * (V_{GS1} - V_{T1})\} \quad [4]$$

Formula [1] cannot be used for the calculation of the gate-source voltage $V_{GS1}$ of the first field effect transistor T1 because this formula is valid only when the first field effect transistor T1 is in saturation as in the conventional amplifier stage shown in FIG. 1. In an amplifier stage in accordance with the invention the first field effect transistor T1 operates in the linear region. Conversely, the second field effect transistor T2 operates in the saturation region. The gate-source voltage $V_{GS1}$ of the first field effect transistor T1 now complies with:

$$V_{GS1} = V_{GS2} + V_{DS1} = \sqrt{(2*I/\beta_2)} + V_{T2} + V_{DS1} \quad [5]$$

Here, $V_{GS2}$ is the gate-source voltage of the second field effect transistor $T_2$, $V_{T2}$ is the threshold voltage of the second field effect transistor $T_2$, and $\beta_2$ is a parameter which refers to the parameter $\beta$ in relation to the second field effect transistor $T_2$. As the first field effect transistor T1 operates in the linear region the drain-source voltage $V_{DS1}$ of the first field effect transistor T1 is substantially, smaller than the gate-source voltage $V_{GS2}$ of the second field-effect transistor T2. Moreover, the threshold voltage, $V_{T1}$ of the first field effect transistor T1 is approximately. equal to the threshold voltage $V_{T2}$ of the second field effect transistor T2. As a result, the following approximation holds $$V_{GS1} - V_{T1} = \sqrt{(2*I/\beta_2)} \quad [6]$$

Substitution of formula [6] in formula [4] yields:

$$R_N = 1/\{\beta_1 * \sqrt{(2*I/\beta_2)}\} \quad [7]$$

Figure 3:
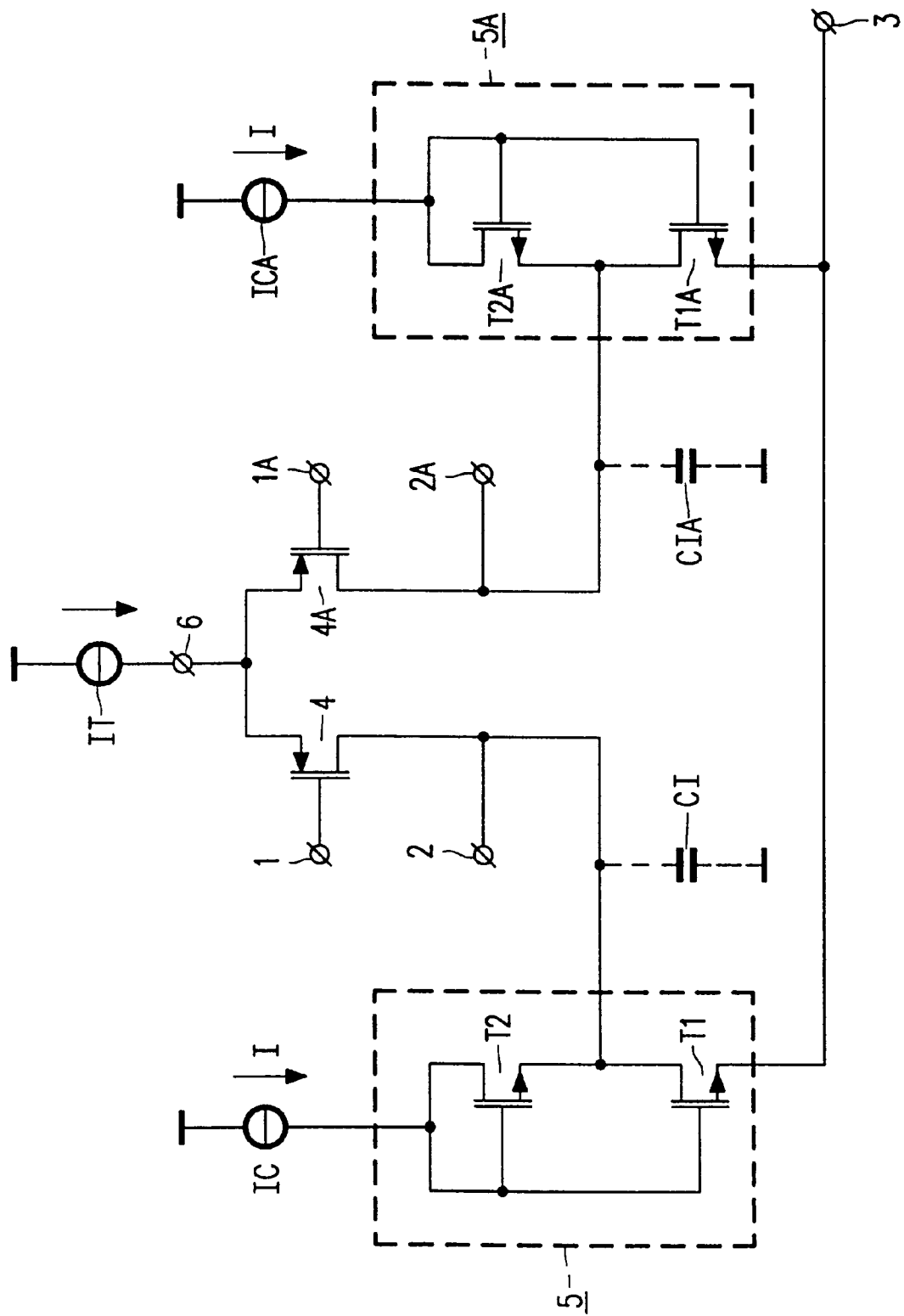
FIG. 3 shows a second embodiment of an amplifier stage of an amplifier in accordance with the invention.

By comparing formula [7] with formula [2] it is apparent that the differential resistance $R_N$ of the load 5 in accordance with the invention has a diode characteristic similar to that of the differential resistance $R_C$ of the diode-connected first field effect transistor T1 of the-conventional amplifier stage. This means that if the direct current I is known-the differential resistance $R_N$ depends only on the parameters $\beta_1$ and $\beta_2$. The spread in the parameters $\beta_1$ and $\beta_2$ is not very large. Therefore, the differential resistance $R_C$ can be predicted fairly accurately. The load 5, which is constituted by the first and the second field effect transistor T1, T2, in fact behaves as a diode-connected field effect transistor, it being understood that the threshold voltage of the diode thus formed, which voltage is equal to the drain-source voltage $V_{DS1}$ of the first field effect transistor T1, is substantially lower than in the case of a conventional diodes FIG. 3 shows a second embodiment of an amplifier stage of an amplifier in accordance with the invention. The present embodiment in fact comprises two amplifier stages in accordance with the embodiment as shown in FIG. 2, the amplifier transistor 4 now being, by way of example, a field effect transistor. The following pairs of reference symbols correspond to like parts or elements: 1, 1A; 2, 2A; 4, 4A; 5, 5A; IC, ICA; T1, T1A; T2, T2A; CI, CIA. The two amplifier stages are coupled to one another via the terminal 6, which results in a differential amplifier having two input terminals 1, 1A for receiving a differential input signal and two output terminals 2, 2A for supplying a differeqtial output signal. A tail current source IT provides the d.c. bias for the amplifier transistors 4, 4A.

The amplifier transistor 4 can alternatively be of a conductivity type opposite to that shown in FIG. 2 and FIG. 3. Moreover, the amplifier transistor 4 can be a bipolar transistor or a field effect transistor both in FIG. 1 and in FIG. 2. The amplifier can be formed in an integrated circuit or by means of discrete components.

I claim:
1. An amplifier comprising an amplifier stage having an input terminal for receiving an input signal; an output terminal for supplying an output signal in response to the input signal; a supply terminal; an amplifier transistor having a main current path coupled to the output terminal; and a load coupled (5) between the output terminal and the supply terminal, characterized in that the load comprises: a first field effect transistor having a source coupled to the supply terminal, a drain coupled to the output terminal, and a gate; and a second field effect transistor having a source coupled to the output terminal, a drain coupled to the gate of the first field effect transistor, and a gate coupled to the drain of the second field effect transistor, the first field effect transistor operating in the linear region and the second field effect transistor operating in the saturation region, and the first and second field effect transistors together having an impedance characteristic corresponding to that of a diode-connected conventional field effect transistor.

2. An amplifier as claimed in claim 1, characterized in that the amplifier comprises a further said amplifier stage, the respective amplifier transistors of the amplifier stage and the further amplifier stage being arranged as a differential amplifier.

3. An amplifier as claimed in claim 2, characterized in that an integration capacitor is coupled to the output terminal.

4. An amplifier as claimed in claim 3, characterized in that the integration capacitor is a field effect transistor.

5. An amplifier as claimed in claim 1, characterized in that an integration capacitor is coupled to the output terminal.

6. An amplifier as claimed in claim 5, characterized in that the integration capacitor is a field effect transistor.

* * * * *